United States Patent [19]

Jun

[11] Patent Number: 5,346,845
[45] Date of Patent: Sep. 13, 1994

[54] PROCESS FOR FORMING A TRENCH CAPACITOR MEMORY CELL

[75] Inventor: Young-Kwon Jun, Seoul, Rep. of Korea

[73] Assignee: Goldstar Electron Co., Ltd., Cheongju, Rep. of Korea

[21] Appl. No.: 960,149

[22] Filed: Oct. 13, 1992

[30] Foreign Application Priority Data

Oct. 12, 1991 [KR] Rep. of Korea ............... 91-17940

[51] Int. Cl.[5] ............... H01L 21/70; H01L 27/00
[52] U.S. Cl. ............... 437/52; 437/60; 437/919
[58] Field of Search ............... 437/47, 52, 60, 919

[56] References Cited

U.S. PATENT DOCUMENTS

| | | | |
|---|---|---|---|
| 4,397,075 | 8/1983 | Fatula, Jr. et al. | 437/52 |
| 4,830,981 | 5/1989 | Baglee et al. | 437/48 |
| 4,921,815 | 5/1990 | Miyazawa | 437/52 |
| 5,106,774 | 4/1992 | Hieda et al. | 437/52 |

OTHER PUBLICATIONS

Process Integration for 64M DRAM Using An Asymmetrical Stacked Trench Capacitor (AST) Cell by K. Sunouchi, et al. IEDM pp. 647–650 (1990).
A Surrounding Isolation–Merged Plate Electrode (SIMPLE) Cell With Checkered layout for 256MBit DRAMs and Beyond by T. Ozaki, et al. IEDM pp. 469–472 (1991).

Primary Examiner—Robert Kunemund
Assistant Examiner—H. Jey Tsai
Attorney, Agent, or Firm—Alan R. Loudermilk

[57] ABSTRACT

A trench capacitor memory cell having a semiconductor substrate, an active region having a transistor on a portion of the semiconductor substrate, a field region formed by removing portion of the semiconductor substrate except for portions of the active region to a certain depth below the surface of the semiconductor substrate, a capacitor trench region formed in contact with a part of the active region and within the field region, and a polysilicon plug formed within the field region except for the trench region, and insulated by being surrounded by an insulating layer.

3 Claims, 5 Drawing Sheets

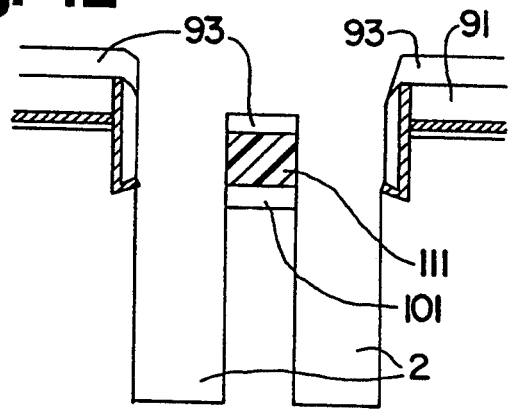
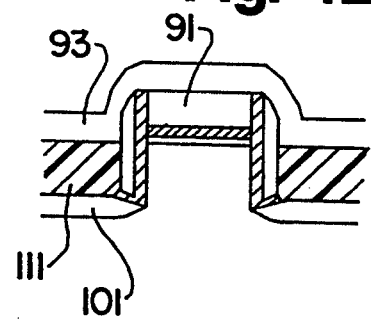
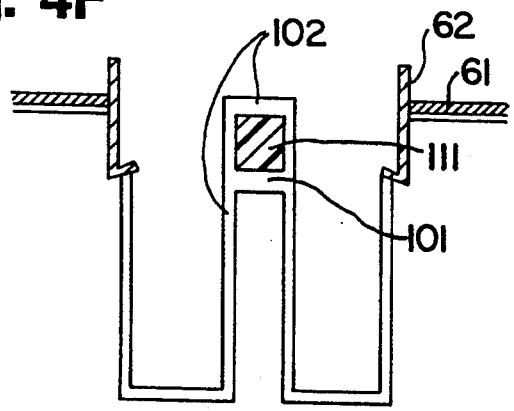
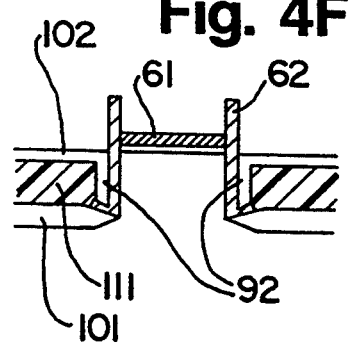
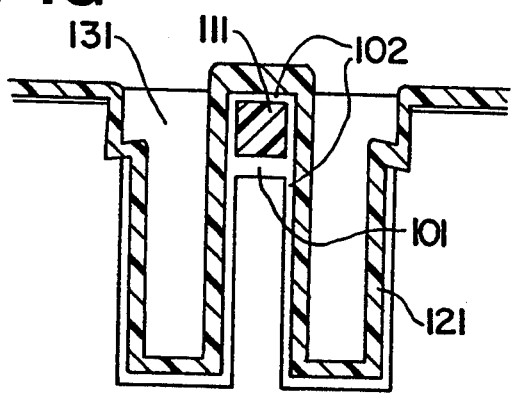
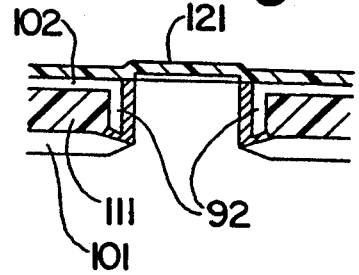

PROCESS FOR FORMING A TRENCH CAPACITOR MEMORY CELL

FIELD OF THE INVENTION

The present invention relates to a trench capacitor memory cell and a process for formation thereof, and more particularly to a trench capacitor memory cell in which a capacitor of high capacitance is formed in a small area, thereby achieving a high density memory cell.

BACKGROUND OF THE INVENTION

A memory cell similar to the cell of the present invention is the "AST" (asymmetrical stacked trench capacitor) cell, which is discussed in "Semiconductor World", July 1991, on pages 77–82. This AST cell will be briefly described below with reference to FIGS. 1 and 3.

Referring to FIG. 3, as shown in FIG. 3a, field oxide layer 5 including portion 8 is formed by applying a planar method in order to isolate certain elements, silicon nitride layer 6 is deposited thereon, and then trench 2 with a depth of 3.5 micrometers is formed. Then oxide layer 9 of 50 nanometers thickness is formed within the trench, and photoresist 7 is coated thereon and patterned by a photolithographic process.

Then, relevant portions of oxide layer 9 are etched using photoresist pattern 7 and silicon nitride layer 6 formed on the silicon substrate as a mask, thereby forming a contact portion for a storage electrode of a storage capacitor.

Then, as shown in FIG. 3b, nitride layer 6 and photoresist 7 (used as a mask) are removed, and polysilicon 12 is deposited so that the polysilicon serves as the storage electrode. Then an "As" ion implantation is carried out, and polysilicon 12 is patterned to form a capacitor electrode.

Then, as shown in FIG. 3c, NO layer 14 (nitride-oxide, $Si_3N_4$-$SiO_2$) as a dielectric medium of the capacitor is deposited on polysilicon storage electrode 12 of the capacitor, and polysilicon is deposited and patterned to form plate electrode 15 of the storage capacitor, thereby completing formation of the capacitor.

FIG. 1 illustrates the layout of the AST cell formed in the above described manner.

In this AST cell, trench 2, wherein the capacitor is formed, is arranged in an asymmetrical manner relative to active region 1 of the device, and, therefore, contact 120 of storage electrode 12 is completely included within active region 1, while the capacitor is electrically isolated from the substrate by oxide layer 9 which is formed within trench 2. Owing to the asymmetrical arrangement of trench 2, a distance is secured between contact 120 of storage electrode 12 and a nearby element. Further, owing to the existence of the oxide layer which is formed on the inner wall of the trench, leakage currents can be decreased between adjacent trenches, thereby making it possible to obtain a fine structure.

However, as shown in FIG. 1, if the minimum distance between the trenches, the shorter width of the active region and the minimum width of a design rule are represented by "d", there exists a distance "a" between capacitor electrode contact 120 and word line 3, and a distance "b" between the trench and the corner of the active region.

Therefore, the minimum pitch $P_W$ and the length of the active region are larger than $2 \times d$ and $3 \times d$, respectively, and therefore, there is a limit to achieving a memory cell with a fine structure.

Further, when forming the capacitor electrode contact, a photoresist is used, and consequently variations in contact resistance may occur due to alignment errors.

SUMMARY OF THE INVENTION

The present invention is intended to overcome the above described disadvantages of the conventional technique.

Therefore, objects of the present invention are to provide an improved trench capacitor cell and a process for formation thereof in which the process is simplified, an extra margin for the process is assured, and a polysilicon plug is used instead of a field oxide layer.

According to the present invention, the memory cell may be formed with a fine structure by using the minimum distance d between the trenches as the minimum distance of the design rule, and the capacitor electrode contact may be formed in a self-aligned manner by utilizing the side wall of a silicon nitride layer.

Further, the polysilicon electrode also may be formed in a self-aligned manner, thereby making it possible to simplify the formation process, and to secure process margins.

Further, instead of forming a field oxide layer, an improved method of using a polysilicon plug is utilized, and consequently the problem due to the active region becoming reduced as a result of a "bird's beak" of the field oxide layer is solved.

The structure of the cell of the present invention is a "REST" (rotational stacked trench capacitor) cell, and it is laid out as shown in FIG. 2, in which "a" and "b" are eliminated unlike the conventional layout of FIG. 1.

The trench constituting a part of the capacitor is L-shaped, and is disposed in a rotationally symmetrical form relative to the active region in such a manner that the corners of the storage electrode and the corners of the active region are contacted with each other, and that the capacitor is electrically insulated from the substrate.

If the distance between the trenches of the capacitors is represented by "d", both the distance "a" between the capacitor electrode contact and the word line and the distance "b" between the corners of the active region and the trenches may be reduced to $a=b=0$ (unlike the AST cell of FIG. 1), and, therefore, the minimum pitch $P_W$ of the word line and the minimum pitch $P_A$ of the active region may be made to be equivalent to $2 \times d$ and $3 \times d$, respectively, with the result that a finer structure may be formed as compared with the AST cell.

To achieve the above objects, the trench capacitor cell of the present invention includes: a semiconductor substrate; an active region with a transistor formed on the relevant portion of the semiconductor substrate; a field region formed by etching the portion of the substrate except for the active region to a certain depth below the surface; a trench region within the field region for serving as a capacitor and being formed in contact with a side of the active region; and a polysilicon plug electrically insulated by being surrounded by an insulator and disposed within the field region except for the trench region.

The transistor formed within the active region includes source/drain regions and a gate, and one of the source/drain regions of the transistor is connected to the trench capacitor foraged in the trench.

Preferably, the polysilicon plug is a doped conductive element, and is electrically connected to Vss or to ground.

Further, the trench region is L-shaped, fully contacted with the shorter edge of the rectangular active region, and contacted with the longer edge of the active region as much as the length of the shorter edge, while the width of the trench region roughly corresponds to the shorter length of the active region.

Further, the polysilicon plug is composed of an electrically conductive material, and is electrically insulated from the active region by a nitride layer and an oxide layer, while it is also electrically insulated from the trench region by an oxide layer.

In achieving the above objects, the process for formation of a trench capacitor cell according to the present invention includes the steps of:

a) depositing a pad oxide layer, a first silicon nitride layer and a first oxide layer on a silicon substrate in the cited order, and patterning to form an active region by etching the above layers so as to remain only in the active region portion;

b) forming a field region by etching the portion of the silicon substrate except for the action region portion, depositing a second silicon nitride layer to a certain thickness, depositing a second oxide layer thereupon, and then, forming an active region insulating side wall (consisting of the nitride layer and the oxide layer and surrounding the active region) by carrying out an anisotropic dry etching of the second oxide layer and the second nitride layer;

c) growing a third oxide layer on the bottom of the field region by applying a thermal oxidation process;

d) depositing the first doped polysilicon, forming a polysilicon plug within the field region by carrying out an isotropic dry etching of the first polysilicon, depositing a fourth oxide layer, and defining a trench region by means of a photoresist;

e) carrying out a dry etching of the fourth oxide layer by using the photoresist as a mask, etching the first polysilicon and the third oxide layer in the cited order with the photoresist left intact, forming a trench by carrying out an anisotropic dry etching on the substrate, and removing the photoresist;

f) removing the exposed fourth oxide layer and the first and second oxide layers by carrying out an oxide layer etching process, and forming a fifth oxide layer on the inside of the trench and the polysilicon plug by carrying out a thermal oxidation process;

g) etch-removing the exposed silicon nitride layer, depositing a second doped polysilicon, depositing an insulating layer for flattening the surface of the wafer, and forming an flattened insulating plug within the trench by etching back the insulating layer;

h) patterning the storage electrode of the capacitor in a self-aligned manner by etching back the exposed second polysilicon, removing the insulating plug from within the trench, and forming a capacitor dielectric layer and a capacitor plate electrode, thereby forming a capacitor; and i) forming a gate and source/drain regions of a transistor after forming the capacitor.

Preferably, an ion implantation process is carried out on the bottom of the trench by using a dopant such as boron after carrying out step e.

Further, at step g, a storage electrode of polysilicon is formed after etch-removing the silicon nitride layer of the side wall of the trench, so that a contact between the storage electrode of the capacitor and the active region is self-aligned.

BRIEF DESCRIPTION OF THE DRAWINGS

The above objects and other advantages of the present invention will become more apparent by describing in detail the preferred embodiment of the present invention with reference to the attached drawings in which:

FIG. 4 illustrates the process for formation of a REST cell according to the present invention, in which:

FIG. 4(A) to 4(I) are sectional views taken along line 4A—4A of FIG. 2; and

FIG. 4(A') to 4(I)' are sectional views taken along line 4A—4A' of FIG. 2.

DESCRIPTION OF THE PREFERRED EMBODIMENT

The process for formation of a REST cell according to the present invention will be described based on a preferred embodiment and with reference to FIG. 4.

Figure 2:
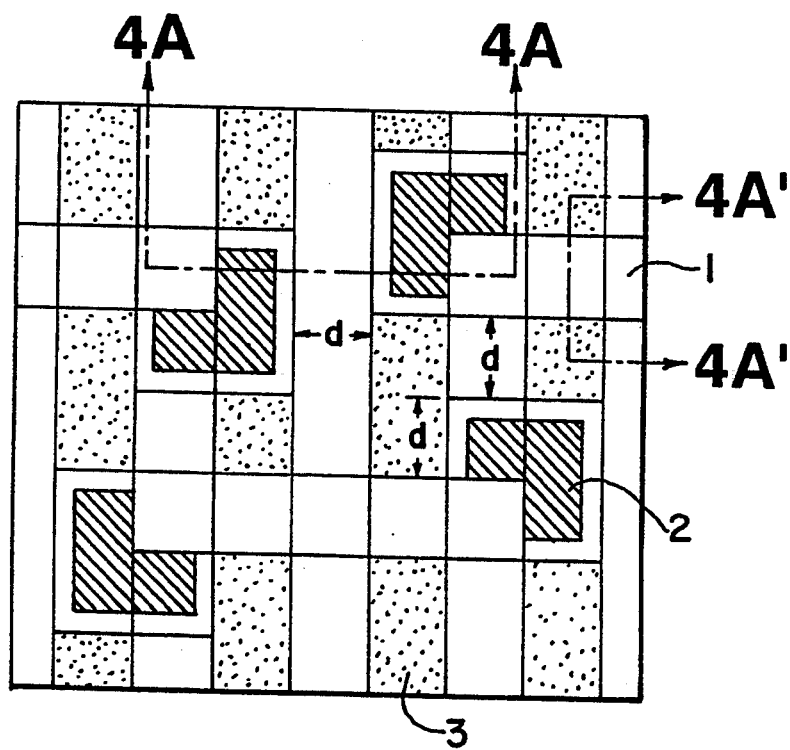
FIG. 2 illustrates the layout of a REST cell according to the present invention.
Figure 3A:
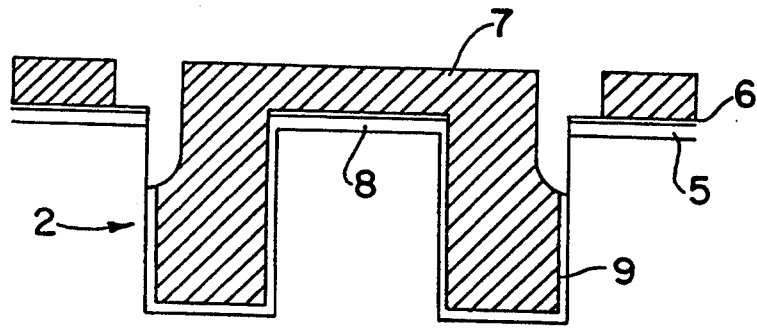
FIGS. 3(A)–3(C) illustrates the process for formation of the conventional AST cell.
Figure 3B:
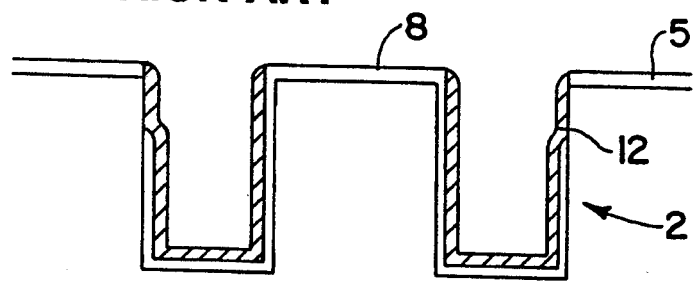
Figure 3C:
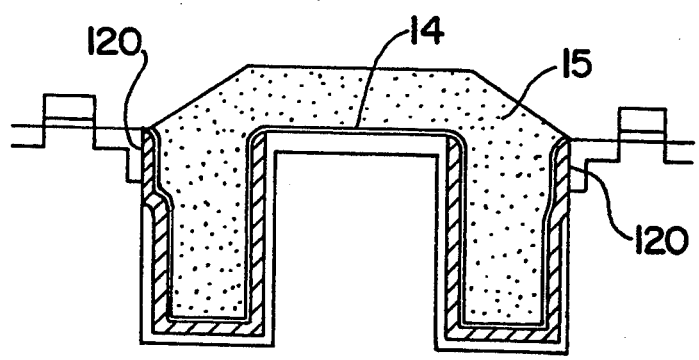

FIGS. 4(A) to 4(I) illustrate a part of the cross section taken along line 4A-4A of FIG. 2, while FIGS. 4 (A') to 4 (I') illustrate a part of the cross section taken along line 4A-4A' of FIG. 2.

Figure 4A:
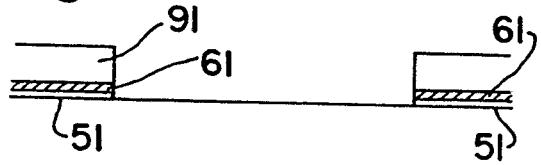
Figure 4A:
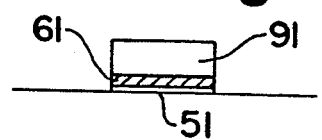

First as shown in FIGS. 4(A) and 4(A'), pad oxide layer 51, first silicon nitride layer 61 and chemical vapor deposited first oxide layer 91 are formed upon a silicon substrate in the cited order, and then an active region is patterned by a conventional photolithographic process.

Figure 4B:
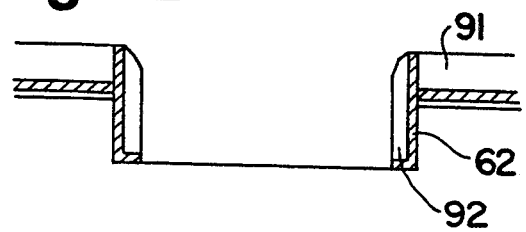
Figure 4B:
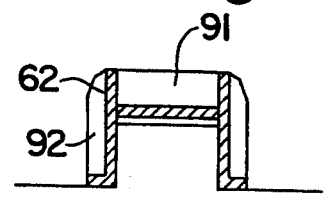

Then, as shown in FIG. 4(B), a field region is formed by etching the portion of the silicon substrate except for the active region portion, and second silicon nitride layer 62 is deposited in a thickness of less than 10,000Å for purposes of a trench thermal oxidation mask. Then, second oxide layer 92 is deposited, and a side wall of second oxide layer 92 is formed by carrying out an anisotropic dry etching of second oxide layer 92, while, thereafter, exposed first nitride layer is etched back. Thus, an active region insulating layer consisting of a nitride layer and an oxide layer is formed in such a manner as to surround the active region.

Figure 4C:
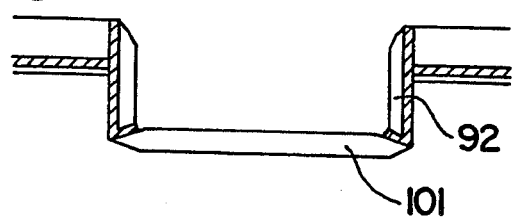
Figure 4C:
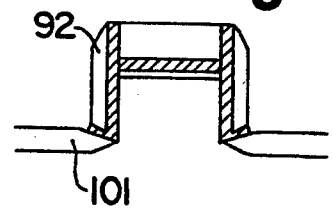

Thereafter, as shown in FIG. 4(C), the structure is subjected to a heat treatment at a temperature of over 600° C. under an atmosphere (ambient) including oxygen, so that third oxide layer 101 is formed to a thickness of 300–2000Å on the bottom of the etched field region.

Figure 4D:
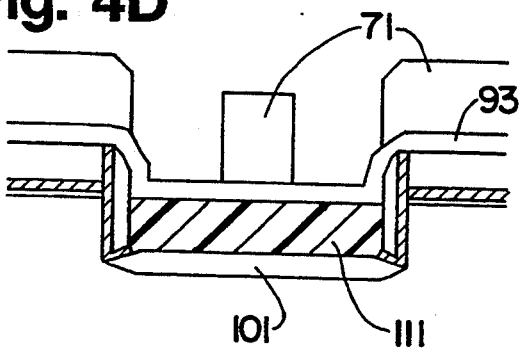
Figure 4D:
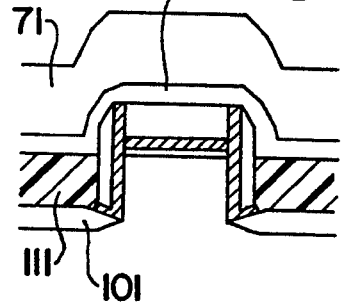

Then, as shown in FIG. 4(D), doped first polysilicon 111 is deposited, and doped first polysilicon 111 is subjected to an anisotropic dry etching to form a polysilicon plug within the field region. Then fourth oxide layer 93 is deposited, and the trench region where trench 2 (see FIG. 2) is to be formed is defined by using photoresist 71.

Thereafter, as shown in FIG. 4(E), fourth oxide layer 93 is dry-etched using photoresist 71 as a mask, and then, anisotropic etches are sequentially carried out on first polysilicon 111 and third oxide layer 101 in a self-aligned manner, with photoresist 71 remaining. Then an anisotropic dry etching is carried out on the silicon substrate, thereby forming trenches 2. Alternatively here, a field stop ion implantation may be performed using a dopant such as boron or the like. Thereafter, photoresist 71 is removed.

Then, as shown in FIG. 4(F), fourth oxide layer 93 and first oxide layer 91 and second oxide layer 92, which are exposed to the outside, are removed by carrying out an oxide layer etching process, and fifth oxide layer 102 is formed on the inside of the trench and around the polysilicon plug by carrying out a thermal oxidation process.

This process is carried out in such a manner that thermal oxidation layer 102 is formed in a thickness of 300–15,000Å on the inside of the trench and around polysilicon plug 111 by carrying out a heat treatment at a temperature of over 600° C. in an atmosphere including oxygen. The growth of thermal oxidation layer 102 is inhibited on the portion of the wafer covered by the nitride layer.

Under this condition, polysilicon plug 111, which is surrounded by an oxide layer, is connected along the edges of active region 1 and trench 2, and therefore, a metal-plug contact may be formed to connect polysilicon plug 111 to Vcc or ground during a back end metallization process, thereby utilizing it as an element insulating means.

Then, as shown in FIG. 4(G), silicon nitride layer 62 of the side wall of the trench and nitride layer 61 upon the active region which are exposed are etch-removed, and doped second polysilicon 121 is deposited over the overall surface of the wafer. Then an insulating layer is deposited for planarization and is etched back, thereby forming insulating plug 131 within the trench.

Figure 4H:
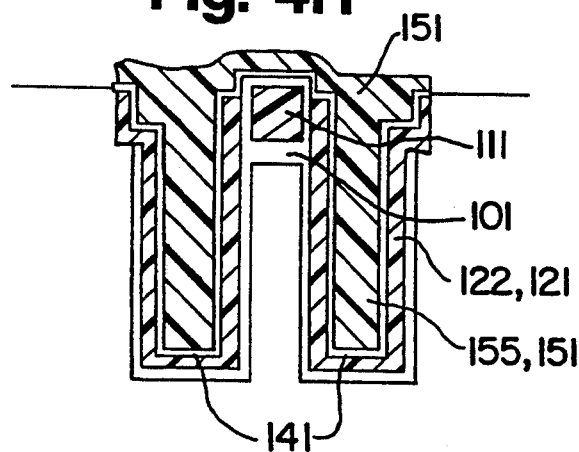
Figure 4H:
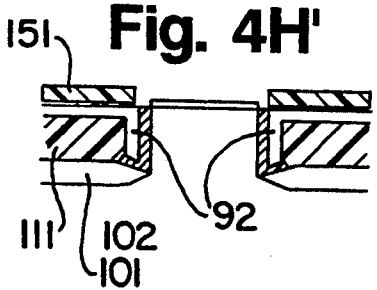

Thereafter, as shown in FIG. 4(H), second polysilicon 121 is etched back in such a manner as to leave doped second polysilicon 121 only within the trench, and storage electrode 122 of the capacitor is made in a self-aligned manner. Then, insulating plug 131 lying within the trench is removed by a photo etching process, and capacitor dielectric layer 141 and polysilicon layer 151 are deposited, which are then patterned to form capacitor plate electrode 155.

Thus, storage electrode 122, dielectric layer 141 and plate electrode 155 for the capacitor are formed.

Figure 4I:
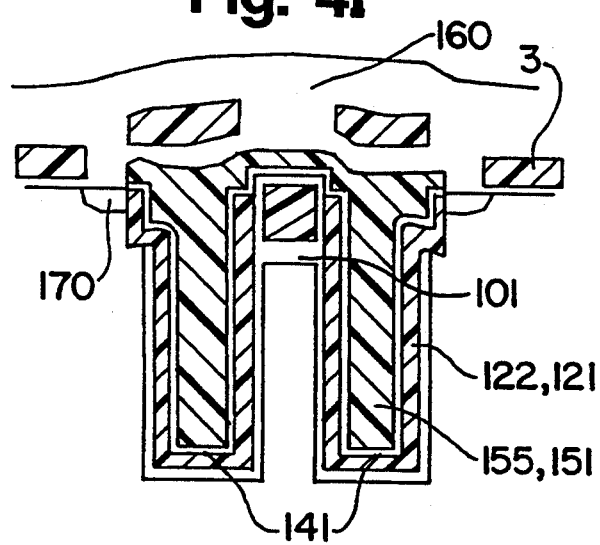
Figure 4I:
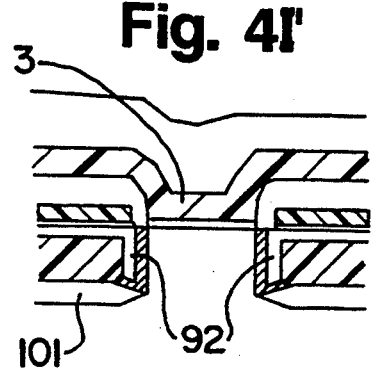

Then, as shown in FIG. 4(I), processes for formation of gate 3 and source/drain regions 170 are carried out. Under this condition, source/drain regions 170 and the storage electrode of the capacitor form a contact in a self-aligned manner.

Thereafter, the normal back end process is carried out, thereby completing the memory cell.

According to the present invention as described above, an extra process margin is assured, and an improvement is achieved by using a polysilicon plug instead of the conventional field oxide layer.

Further, the trench constituting the capacitor is L-shaped, and is rotationally symmetrical relative to the active region, and therefore, the corners of the storage electrode and the active region are made to contact with each other, while the capacitors are electrically insulated from the substrate by the oxide layer formed on the side wall of the trench.

Figure 1:
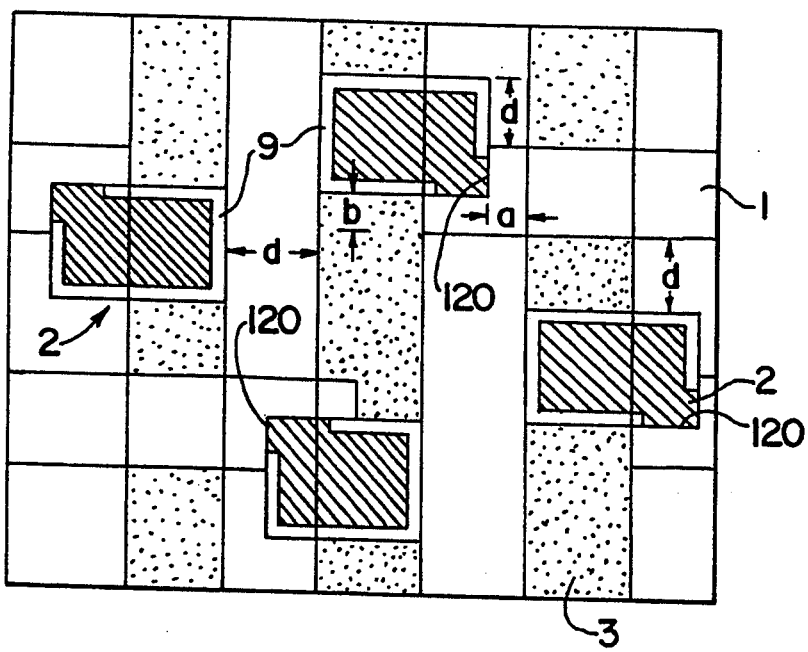
FIG. 1 illustrates the layout of the conventional AST cell.

If the minimum distance between the trenches of the capacitors and the minimum design width are represented by d, both the distance "a" between the capacitor electrode contact and the word line and the distance "b" between the trench and the corner of the active region can be reduced (a=b=0) unlike the case of the AST cell discussed with reference to FIG. 1. Therefore, the minimum pitch $P_W$ of the word line and the minimum pitch $P_A$ of the active region can be made to be equivalent to $2 \times d$ and $3 \times d$, respectively, with the result that the memory cell of the present invention has a finer structure as compared with the AST cell.

That is, a memory cell of a fine structure is provided by making the distance "d" between the trenches become equivalent to the minimum gap of the design rule. Further, the capacitor electrode contact is formed in a self-aligned manner by utilizing the side wall of the silicon nitride layer, and the silicon electrodes are also formed in a self-aligned manner, thereby simplifying the formation process, and assuring extra process margin. Further, instead of forming a field oxide layer, an improved method of using a polysilicon plug is adopted, and therefore a solution is furnished to the problem that the active region is reduced because of the field oxide layer.

While a preferred embodiment of the present invention has been illustrated and described, it is anticipated that various changes and modifications will be apparent to those skilled in the art, and that such changes may be made without departing from the spirit and scope of the present invention as defined by the following claims:

What is claimed is:

1. A process for forming a trench capacitor memory cell, comprising the steps of:

a) forming a pad oxide layer, a first silicon nitride layer and a first oxide layer upon a silicon substrate, patterning to form an active region by etching the pad oxide layer, the first silicon nitride layer and the first oxide layer so that the remaining portions define the active region, and forming a field region by etching the silicon substrate except for the active region;

b) depositing a second silicon nitride layer to a certain thickness, depositing a second oxide layer thereupon, and forming an active region insulating layer around the active region by anisotropic dry etching the second oxide layer and the second nitride layer so that the insulating layer comprising nitride and oxide remains on the sides and top of the active region;

c) growing a third oxide layer on the bottom of the field region by a thermal oxidation process;

d) depositing a doped first polysilicon, and forming a polysilicon plug within the field region by anisotropic dry etching the first polysilicon;

e) depositing a fourth oxide layer, defining a trench region within the field region by a photoresist process, dry-etching the fourth oxide layer using the photoresist as a mask, sequentially etching the first polysilicon and the third oxide layer, wherein the photoresist used as a mask substantially remains, and forming a trench by anisotropic dry etching the silicon substrate;

f) removing the photoresist, removing the exposed portions of the first and second oxide layers and the fourth oxide layer by an oxide layer etching process, and forming a fifth oxide layer on the inside walls of the trench and around the polysilicon plug by a thermal oxidation process;

g) etching the exposed portion of the first and second silicon nitride layers, depositing a doped second polysilicon, forming a flat insulating layer, and forming an insulating plug within the trench by an etching process;

h) patterning a capacitor storage electrode in a self-aligned manner by etching back the exposed second polysilicon, removing the insulating plug from within the trench, and forming a capacitor dielectric layer and capacitor plate electrode, thereby forming a capacitor; and i) forming a transistor gate, and forming a source/drain region of the transistor in a self-aligned manner.

2. The process for forming a trench capacitor memory cell as claimed in claim 1, wherein step e further comprises the step of performing a field stop ion implantation using a dopant such as boron.

3. The process for forming a trench capacitor memory cell as claimed in claim 1, wherein at step g a contact between the active region and the storage electrode of the capacitor is formed in a self-aligned manner by forming the doped second polysilicon after etching the exposed silicon nitride layer along the side wall of the trench.

* * * * *